US011022630B2

(12) United States Patent
Ha et al.

(10) Patent No.: US 11,022,630 B2
(45) Date of Patent: Jun. 1, 2021

(54) MEASUREMENT OF CURRENT WITHIN A CONDUCTOR

(71) Applicant: General Electric Technology GmbH, Baden (CH)

(72) Inventors: Hengxu Ha, Stafford (GB); Celso Souza, Santa Catarina (BR); Davi Bernardi, Santa Catarina (BR); Xianwu Zeng, Stafford (GB); Elias Bencz, Santa Catarina (BR)

(73) Assignee: General Electric Technology GmbH, Baden (CH)

( * ) Notice: Subject to any disclaimer, the term of this patent is extended or adjusted under 35 U.S.C. 154(b) by 69 days.

(21) Appl. No.: 16/332,860

(22) PCT Filed: Sep. 14, 2017

(86) PCT No.: PCT/EP2017/073127
§ 371 (c)(1),
(2) Date: Mar. 13, 2019

(87) PCT Pub. No.: WO2018/050741
PCT Pub. Date: Mar. 22, 2018

(65) Prior Publication Data
US 2019/0187186 A1 Jun. 20, 2019

(30) Foreign Application Priority Data
Sep. 15, 2016 (EP) .................................. 16188995

(51) Int. Cl.
*G01R 15/18* (2006.01)
*G01R 19/165* (2006.01)
(Continued)

(52) U.S. Cl.
CPC ....... *G01R 15/181* (2013.01); *G01R 19/0015* (2013.01); *G01R 19/16528* (2013.01);
(Continued)

(58) Field of Classification Search
CPC ............ G01R 15/181; G01R 19/16528; G01R 19/16571; G01R 19/2509; G06F 7/64
See application file for complete search history.

(56) References Cited

U.S. PATENT DOCUMENTS

| 5,804,965 A | * | 9/1998 | Woolley | ............... | G01R 33/028 324/244 |
| 6,094,044 A | * | 7/2000 | Kustera | ................ | G01R 15/181 324/127 |

(Continued)

FOREIGN PATENT DOCUMENTS

| DE | 102012107021 A1 | 2/2014 |
| EP | 1752246 A1 | 2/2007 |

(Continued)

OTHER PUBLICATIONS

European Search Report and Written Opinion dated Mar. 13, 2018 which was issued in connection with EP 16188995.1 which was filed on Sep. 15, 2016.

(Continued)

*Primary Examiner* — Patrick Assouad
*Assistant Examiner* — Demetrius R Pretlow
(74) *Attorney, Agent, or Firm* — Eversheds Sutherland (US) LLP

(57) ABSTRACT

In the field of Rogowski coils for the measurement of current within a conductor there is provided an electrical interface for connection to a Rogowski coil arranged around a primary conductor. The electrical interface includes an input that is configured to sample an input voltage signal from the Rogowski coil. The electrical interface also has an integrator circuit which includes an integrator module that is configured to integrate the sampled input voltage signal to provide an output voltage signal from which can be derived a primary current flowing through the primary conductor. The (Continued)

integrator module employs a transfer function that includes an attenuation factor.

11 Claims, 1 Drawing Sheet

(51) Int. Cl.
    *G01R 19/00*     (2006.01)
    *G06F 7/64*     (2006.01)
    *G01R 19/25*     (2006.01)
    *G01R 19/32*     (2006.01)

(52) U.S. Cl.
    CPC ............... *G01R 19/16571* (2013.01); *G01R 19/2509* (2013.01); *G06F 7/64* (2013.01); *G01R 19/32* (2013.01)

(56) References Cited

U.S. PATENT DOCUMENTS

| | | | |
|---|---|---|---|
| 6,614,218 B1* | 9/2003 | Ray | G01R 15/181 324/117 R |
| 6,670,799 B1* | 12/2003 | Bull | G01R 15/181 324/127 |
| 6,781,361 B2 | 8/2004 | Nestler | |
| 6,963,195 B1* | 11/2005 | Berkcan | G01R 15/181 324/117 R |
| 7,548,054 B2 | 6/2009 | Tan et al. | |
| 2007/0279042 A1* | 12/2007 | Tan | G01R 15/181 324/142 |
| 2011/0026180 A1* | 2/2011 | Haible | H03H 11/46 361/93.1 |
| 2014/0103905 A1* | 4/2014 | Johnson | G01R 15/181 324/127 |
| 2014/0253102 A1* | 9/2014 | Wood | G01R 19/0084 324/140 R |
| 2015/0015244 A1* | 1/2015 | Ray | G01R 15/181 324/127 |
| 2015/0028850 A1 | 1/2015 | Pascal et al. | |
| 2015/0028853 A1 | 1/2015 | Pascal | |
| 2015/0355255 A1* | 12/2015 | Dayan | G01R 31/50 702/58 |
| 2015/0362532 A1* | 12/2015 | Chartouni | G01R 15/18 324/126 |
| 2016/0011249 A1* | 1/2016 | Miller, III | H02H 1/0015 702/58 |
| 2016/0091535 A1* | 3/2016 | Bannister | G01R 15/125 324/127 |
| 2016/0146857 A1* | 5/2016 | Behrends | G01R 15/183 324/127 |
| 2016/0151109 A1* | 6/2016 | Buck | A61B 18/1482 606/35 |
| 2016/0154034 A1* | 6/2016 | Buck | G01R 15/18 324/117 R |
| 2016/0223592 A1* | 8/2016 | Vos | G01R 15/181 |
| 2017/0025693 A1* | 1/2017 | Keskula | H01M 8/04649 |
| 2017/0356935 A1* | 12/2017 | Hurwitz | G01R 19/12 |
| 2018/0074098 A1* | 3/2018 | Wu | G01R 19/00 |
| 2018/0358942 A1* | 12/2018 | Hurwitz | H03F 3/45717 |
| 2019/0222017 A1* | 7/2019 | Miller, III | H02H 1/0092 |

FOREIGN PATENT DOCUMENTS

| | | |
|---|---|---|
| FR | 2794244 A1 | 12/2000 |
| GB | 2508843 A | 6/2014 |

OTHER PUBLICATIONS

Faifer et al.: "An Electronic Current Transformer based on Rogowski Coil" 2008 IEEE Instrumentation and Measurement Technology Conference: May 15, 2008.

Al-Alaoui: "Class of digital integrators and differentiators" IET Signal Processing vol. 5 No. 2 Apr. 15, 2011.

International Search Report and Written Opinion dated Dec. 15, 2017 which was issued in connection with PCT/EP2017/073127 which was filed on Sep. 14, 2017.

* cited by examiner

MEASUREMENT OF CURRENT WITHIN A CONDUCTOR

FIELD OF INVENTION

This invention relates to an electrical interface for connection to a Rogowski coil that is arranged around a primary conductor.

BACKGROUND OF THE DISCLOSURE

A Rogowski coil 10 is an electrical device for measuring alternating current (AC). As shown in FIG. 1, it consists of a helical coil 12 of wire 14 which is wrapped around a primary conductor 16 whose current, i.e. primary current $i_p$, is to be measured. The coil 12 is mutually coupled with the primary conductor 16 via air, and so the absence of an iron core means that no saturation of the coil 12 will occur, irrespective of the level of current flowing through the primary conductor 16.

The voltage induced in the coil 12 is proportional to the rate of change, i.e. the derivative, of the primary current $i_p$ flowing through the primary conductor 16. The output of the Rogowski coil 10 can therefore be connected to an electrical or electronic integrator to provide an output signal that is proportional to the primary current $i_p$.

BRIEF SUMMARY

According to an aspect of the invention there is provided an electrical interface, for connection to a Rogowski coil arranged around a primary conductor, including:
a. an input configured to sample an input voltage signal from the Rogowski coil; and
b. an integrator circuit including an integrator module configured to integrate the sampled input voltage signal to provide an output voltage signal from which can be derived a primary current flowing through the primary conductor, the integrator module employing a transfer function that includes an attenuation factor.

The inclusion within the integrator circuit of an integrator module which employs a transfer function that includes an attenuation factor desirably maintains stability of the operation of the integrator module without unduly impacting on its accuracy, particularly at very high sampling frequencies, e.g. many tens of thousands of samples per second.

The attenuation factor gives rise to an error in the derived primary current flowing through the primary conductor that is not greater than a predetermined percentage selected according to the nature of the primary current ($i_p$) flowing through the primary conductor (16).

The percentage error in the derived primary current ($i_p(n)$) may be selected to be:
not greater than 10% when the primary current ($i_p$) is decaying; and
not greater than 0.3% when the primary current ($i_p$) is in steady state.

Such features limit the size of the attenuation factor to a level which provides for an acceptable overall degree of accuracy for the integrator circuit, particularly at very high sampling frequencies (i.e. typically many thousands of samples per second), without sacrificing the stability of operation of the integrator module therein.

Optionally the integrator module employs a transfer function which additionally down-samples a previous output voltage signal.

Down-sampling only a previous output voltage signal, i.e. a feedback output voltage signal, helps to reduce distortion in a subsequent output voltage signal (which might otherwise arise because of the integrator module becoming saturated) without affecting the sampling frequency at which the input operates, which as indicated above may be many tens of thousands of samples per second.

The integrator module may be or include one or more of:
a first rectangular integrator embodying a transfer function in the discrete time domain of the form $$H(z) = \frac{1}{1 - e^{-AT_s N_d} z^{-N_d}};$$

a second rectangular integrator embodying a transfer function in the discrete time domain of the form $$H(z) = \frac{1}{N_d} \frac{\sum_{k=0}^{N_d} z^{-k}}{1 - e^{-AT_s N_d} z^{-N_d}};$$

a trapezoidal integrator embodying a transfer function in the discrete time domain of the form $$H(z) = \frac{1}{N_d} \frac{\sum_{k=0}^{N_d} z^{-k} - \frac{1}{2} - \frac{1}{2} z^{-N_d}}{1 - e^{-AT_s N_d} z^{-N_d}};$$

and
a Taylor's approximation integrator embodying a transfer function in the discrete time domain of the form $$H(z) = \frac{1}{6} \left\{ \frac{1 + 4z^{-N_d/2} + z^{-N_d}}{1 - e^{-AT_s N_d} z^{-N_d}} \right\},$$

where,
a. A is the attenuation factor;
b. $T_s$ is a sampling period of the input voltage signal; and
c. $N_d$ is a down-sampling scale.

Each of the foregoing integrators provides a desired degree of accuracy, particularly at high sampling frequencies, e.g. typically of many thousands per second, while maintaining their operational stability.

In an embodiment of the invention the integrator circuit additionally includes at least one averaging module arranged in communication with the output of the integrator module, the or each averaging module being configured to calculate an average output voltage signal over one or more operating cycles of an electrical system of which the primary conductor forms a part and to subtract the said calculated average output voltage from the output voltage signal provided by the integrator module to establish a corrected output voltage signal.

The inclusion of one or more such averaging modules removes low frequency noise from the output voltage signal provided by the integrator module as well as any inherent DC voltage offset in the input voltage signal when sampling begins.

In an embodiment of the invention the integrator circuit further includes a disturbance detector configured to detect a disturbance in the current flowing through the primary conductor and thereafter suspend operation of the or each averaging module while the disturbance remains.

The inclusion of a disturbance detector, and more particularly suspending operation of the or each averaging module if there is a disturbance in the primary conductor, helps to ensure that the previous output voltage signal from the integrator module is maintained and so the accuracy with which any DC voltage offset is removed from the output voltage signal is unaffected by the disturbance and so is similarly maintained.

Optionally the disturbance detector is configured to determine the absolute value of the sampled input voltage signal and to detect a disturbance in the current flowing through the primary conductor when the absolute value of the sampled input voltage signal exceeds a predetermined threshold.

Such an arrangement readily and reliably implements the detection of a rise in the current flowing in the primary conductor, and hence facilitates the desired detection of a disturbance in the primary conductor.

The integrator circuit still further includes a reconstruction module which is configured to derive the primary current flowing through the primary conductor by multiplying the corrected output voltage signal by a gain factor.

The inclusion of such a reconstruction module desirably permits the integrator circuit to output a primary current value corresponding to the level of current flowing through the primary conductor that can be used, e.g. in other control or monitoring operations associated with the primary conductor.

The reconstruction module may also be configured to modify the corrected output voltage signal to compensate for errors arising from the attenuation factor.

Optionally the reconstruction module carries out one or more of phase compensation and steady state input signal compensation.

The foregoing features help to further maintain the accuracy of the derived primary current.

In a still further embodiment of the invention the reconstruction module is also configured to modify the gain factor according to a measured temperature of the electrical interface.

Such a reconstruction module usefully helps the integrator circuit to indicate actual changes in the derived primary current which might otherwise be masked by temperature changes in or adjacent to the electrical interface.

BRIEF DESCRIPTION OF THE DRAWINGS

There now follows a brief description of embodiments of the invention, by way of non-limiting example, with reference being made to the following figures in which.

DETAILED DESCRIPTION

Figure 1:
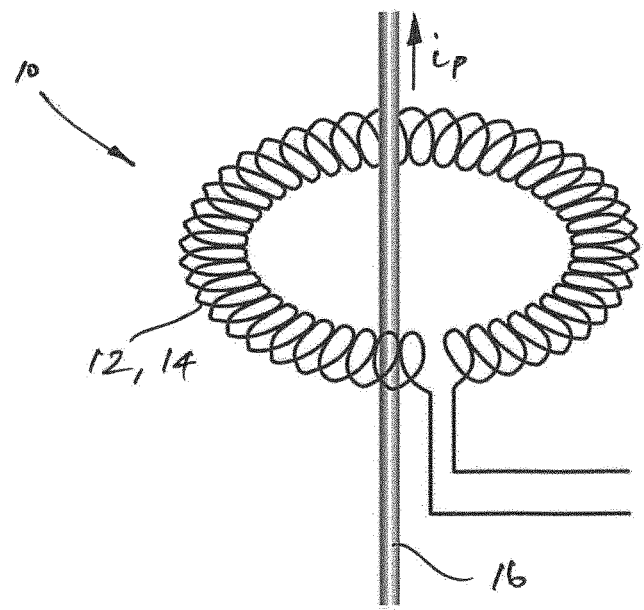
FIG. 1 shows a schematic view of a conventional Rogowski coil arranged around a primary conductor.
Figure 2:
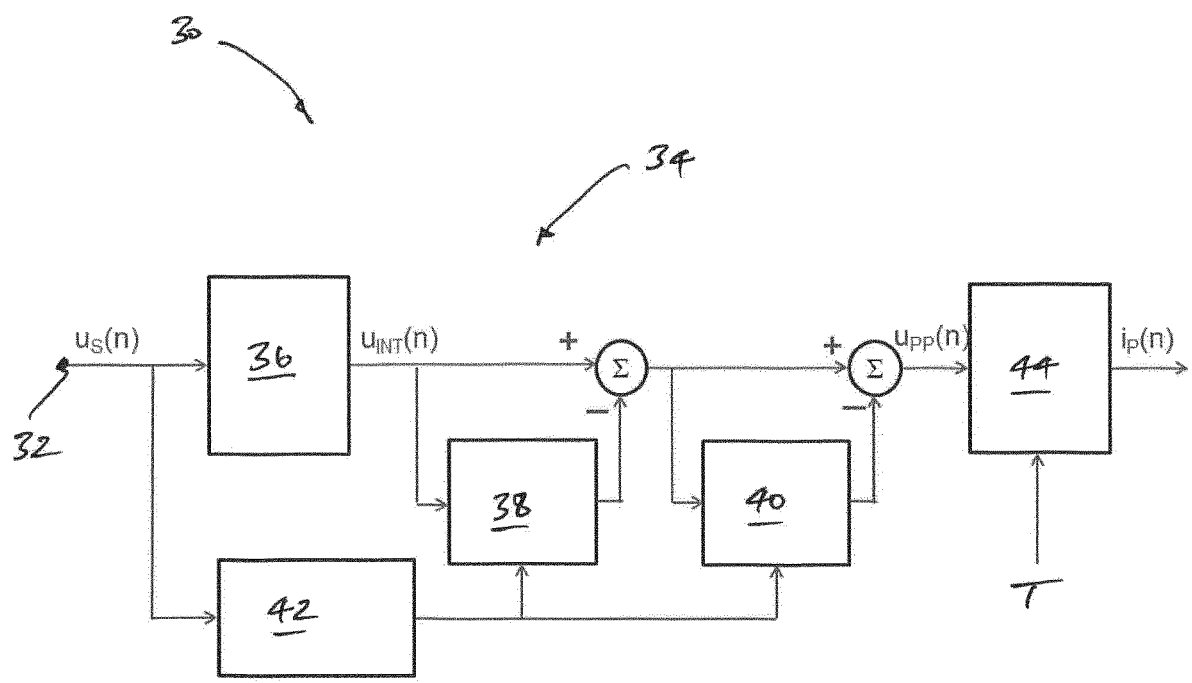
FIG. 2 shows a schematic view of an electrical interface according to an embodiment of the invention.

An electrical interface according to a first embodiment of the invention is designated generally by reference numeral 30, as shown in FIG. 2.

The electrical interface 30 includes an input 32 which is configured to sample an input voltage signal $u_s(n)$ from a Rogowski coil 10 that is arranged around a primary conductor 16.

The input 32 operates at a very high sampling frequency, which is typically many tens of thousands of samples per second and may, for example, be 64,800 Hz which gives a sampling period $T_s$ of 1/64800 seconds, i.e. 0.0000155 seconds.

The electrical interface 30 also includes an integrator circuit 34 which, in turn, includes an integrator module 36 that in the embodiment shown is a digital integrator module 36, i.e. is an integrator module which operates in the discrete time, or digital domain.

The integrator module 36 is configured to integrate the sampled input voltage signal $u_s(n)$ to provide an output signal $u_{INT}(n)$ from which can be derived the primary current $i_p(n)$ flowing through a primary conductor 16 around which an associated Rogowski coil 10 is, in use, arranged.

The integrator module 36 employs a transfer function that includes an attenuation factor A. The attenuation factor A is chosen such that the error in the derived primary current $i_p(n)$ flowing through the primary conductor 16 is not greater than a predetermined percentage which is selected according to the nature of the primary current $i_p$ flowing through the primary conductor 16.

For example, in circumstances when the primary current $i_p$ is decaying then the percentage error is selected to be not more than 10%. When the primary current $i_p$ is in steady state, i.e. neither increasing nor decreasing, then the percentage error in the derived primary current $i_p(n)$ is selected to be not more than 0.3%.

The integrator module 36 also employs a transfer function which additionally down-samples a previous output voltage signal $u_{INT}(n)$, i.e. a feedback output voltage signal as part of its operation.

More particularly, in the embodiment shown the integrator module 36 adopts a rectangular approximation of the required integration as set out in the following frequency expression:

$$u_{INT}(n) = K_1 u_{INT}(n-N_d) + u_s(n)$$

where, $u_{INT}(n)$ is the output voltage signal generated by the integrator module 36;

$u_s(n)$ is the sampled input voltage signal from the associated Rogowski coil 10;

$N_d$ is the down-sampling scale which, by way of example, is 16;

$T_s$ is the sampling period of the input voltage signal $u_s(n)$ which, for an exemplary sampling frequency of 64,800 Hz is given by 1/64,800, i.e. 0.00000155 seconds; and $K_1$ is given by $$K_1 = e^{-AN_d T_s}$$

with,

A being the attenuation factor which, by way of example, is 0.5.

Other values for the down-sampling scale $N_d$, sampling period $T_s$, and attenuation factor A, may be used in other embodiments of the invention.

In view of the above-mentioned frequency expression, the integrator module 36 can be said to define a rectangular integrator that embodies a transfer function in the discrete time domain of the form $$H(z) = \frac{1}{1 - e^{-AT_s N_d} z^{-N_d}}$$

Accordingly, utilising the example values indicated above, the maximum output of the transfer function will be $$\frac{1}{1-e^{-0.5*16*0.0000155}} = 8,100$$

This compares to a maximum output of 129,600 for a conventional integrator which omits both an attenuation factor and the down-sampling of a previous output voltage signal. Such a large potential maximum output, which is an order of magnitude greater than that achieved by the first embodiment of the invention, means that the conventional integrator will very quickly magnify any error in the sampled input voltage signal, particularly at very high sampling frequencies (i.e. many tens of thousands of samples per second), and will therefore become saturated. As a consequence the accuracy of the output of such a conventional integrator is also lost.

In the meantime, an attenuation factor of 0.5 means that a DC offset in the sampled input voltage signal $u_s(n)$ with a decaying time constant of 275 milliseconds results in an error in the derived primary current $i_p(n)$ that is less than 10%.

In other embodiments of the invention (not shown) the integrator module 36 may adopt a more accurate trapezoidal approximation of the required integration, e.g. as set out in the following frequency expression:

$$u_{INT}(n) = K_I u_{INT}(n-N_d) + \left\{ \frac{u_s(n)}{2} + \frac{u_s(n-N_d)}{2} + \sum_{k=n-N_d}^{n} u_s(k) \right\} / N_d$$

Such an integrator module 36 therefore defines a trapezoidal integrator which embodies a transfer function in the discrete time domain of the form $$H(z) = \frac{1}{N_d} \frac{\sum_{k=0}^{N_d} z^{-k} - \frac{1}{2} - \frac{1}{2} z^{-N_d}}{1 - e^{-AT_s N_d} z^{-N_d}}$$

The integrator module 36 may also adopt a Taylor's approximation of the required integration, e.g. as set out in the following frequency expression:

$$u_{INT}(n) = K_1 u_{INT}(n-N_d) + \{u_S(n) + 4u_S(n-N_d/2) + u_S(n-N_d)\}/6$$

Such an integrator module 36 therefore defines a Taylor's approximation integrator which embodies a transfer function in the discrete time domain of the form $$H(z) = \frac{1}{6} \left\{ \frac{1 + 4z^{-N_d/2} + z^{-N_d}}{1 - e^{-AT_s N_d} z^{-N_d}} \right\}$$

In still further embodiments of the invention the integrator module could define a second rectangular integrator (which is more accurate than the first rectangular integrator mentioned hereinabove) that embodies a transfer function in the discrete time domain of the form $$H(z) = \frac{1}{N_d} \frac{\sum_{k=0}^{N_d} z^{-k}}{1 - e^{-AT_s N_d} z^{-N_d}}$$

Returning to the embodiment shown in FIG. 2, the integrator circuit 34 also includes first and second averaging modules 38, 40. The first averaging module 38 is arranged in direct communication with the output of the integrator module 36, and the second averaging module 40 is arranged in communication with the integrator module 36 via the first averaging module 38.

Each averaging module 38, 40 is configured to calculate an average output voltage signal over one operating cycle of an electrical system of which the primary conductor 16 forms a part, and to subtract the calculated average output voltage from the output voltage signal $u_{INT}(n)$ provided by the integrator module 36 to establish a corrected output voltage signal $u_{pp}(n)$.

More particularly, the first averaging module 38 subtracts the calculated average output voltage directly from the output voltage signal $u_{INT}(n)$ provided by the integrator module 36 and the second averaging module 40 subtracts the calculated average voltage from the modified output of the first averaging module 38 to establish the corrected output voltage signal $u_{pp}(n)$.

In other embodiments of the invention the integrator circuit may include fewer than or more than two series-connected averaging modules. One or more of the averaging modules may also calculate an average output voltage over more than one operating cycle of the electrical system of which the primary conductor forms a part.

By way of example one or more of the averaging modules 38, 40 may employ a first method of calculating the average output voltage according to $$y(n) = \frac{1}{N} \sum_{k=n-N+1}^{n} x(k)$$

where, y(n) is the calculated average voltage; and

N is the number of samples per cycle of fundamental frequency $f_0$ of the electrical system of which the primary conductor 16 forms a part, with N being given by $$N = \frac{1}{T_s \times f_0}$$

which, using the example values set out above and a fundamental frequency $f_0$ of 50 Hz, gives $$= \frac{64800}{50}$$
$$= 1296$$

One or more of the averaging modules 38, 40 may also employ a second method of calculating the average output voltage according to $$y(n) = y(n-1) + \frac{x(n)}{N} - \frac{x(n-N)}{N}$$

where N is again given by $$N = \frac{1}{T_s \times f_0}$$

One or more of the averaging modules 38, 40 might still further employ a third method of calculating the average output voltage according to $$y(n) = \frac{h(n) - h(n-N)}{N}$$

where, $$h(n) = h(n-1) + x(n); \text{ and}$$

N is given by $$N = \frac{1}{T_s \times f_0}$$
$$= 1296$$

In addition to the foregoing the integrator circuit 34 also includes a disturbance detector 42 that is configured to detect a disturbance in the current flowing through the primary conductor 16 and thereafter suspend operation of the first and second averaging modules 38, 40 while the disturbance remains.

Such suspension of the operation of the first and second averaging modules 38, 40 means that neither subtracts the calculated average voltage signal from the output voltage signal $u_{INT}(n)$ generated by the integrator module 36, and so the extent to which any DC voltage offset is removed from the output voltage signal $u_{INT}(n)$ is frozen, and thereby is unaffected by the disturbance.

The disturbance detector 42 detects a disturbance in the current flowing through the primary conductor 16 by determining the absolute value of the sampled input voltage signal $u_s(n)$, e.g. the maximum absolute value of the sampled input voltage signal $u_s(n)$ over the previous operating cycle of the electrical system of which the primary conductor 16 forms a part, and establishing that a rise in current has occurred (which is indicative of there being a disturbance in the current flowing in the primary conductor 16) when the absolute value of the sample input voltage exceeds a predetermined threshold.

The integrator circuit 34 also includes a reconstruction module 44 which is configured to derive the primary current $i_p(n)$ flowing in the primary conductor 16 by multiplying the corrected output voltage signal $u_{pp}(n)$, i.e. as output by the second averaging module 40, by a gain factor $K_L(T_c)$.

The reconstruction module 44 also, first of all, modifies the corrected output voltage $u_{pp}(n)$ to compensate for errors arising from the attenuation factor A.

More particularly, the reconstruction module 44 carries out phase compensation $N_{comp}$ and steady state input signal compensation $A_{comp}$ to produce a modified corrected output voltage signal $i_{pp}(n)$ according to $$i_{PP}(n) = A_{comp} u_{PP}(n - N_{comp})$$

where, $N_{comp}$ is the number of samples for phase compensation and is given by $$N_{comp} = \text{floor}\left(\frac{\pi/2 - \arctan(\omega_0/A)}{\omega_0 T_s}\right);$$

and $A_{comp}$ is the compensation value for the steady state input signal which is given by $$A_{comp} = N_d \omega_0 T_s \sqrt{1 + \left(\frac{A}{\omega_0}\right)^2}$$

with, $\omega_0$ being the angular frequency of the associated electrical system of which the primary conductor 16 is a part, which is given by $\omega_0 = 2\pi f_0$ (with $f_0$ being the fundamental frequency of the associated electrical system which, as given above by way of example is 50 Hz, but might also be 60 Hz).

Thereafter the reconstruction module 44 derives the primary current $i_p(n)$ flowing in the primary conductor 16 by multiplying the modified corrected output voltage signal $i_{pp}(n)$ according to the following $$i_P(n) = K_L(T_c) i_{PP}(n)$$

where, $K_L(T_c)$ is the gain factor which is given by $$K_L(T_c) = K_0 + \alpha(T - T_0) + \beta(T - T_0)^2$$

with, $K_0$ being $1/L_{Rogow}$ which is a characteristic of the Rogowski coil 10 that is determined under laboratory conditions at a standard temperature $T_0$ of 20° C.;

$\alpha$ and $\beta$ being temperature dependent coefficients; and

T being a measured temperature of the electrical interface 30.

What we claim is:

1. An electrical interface, for connection to a Rogowski coil arranged around a primary conductor, comprising:
    an input configured to sample an input voltage signal from the Rogowski coil; and
    an integrator circuit including an integrator module configured to integrate the sampled input voltage signal to provide an output voltage signal from which can be derived a primary current flowing through the primary conductor, the integrator module employing a transfer function that includes an attenuation factor, and the integrator module further employs the transfer function or a different transfer function which additionally down-samples a previous output voltage signal.

2. The electrical interface according to claim 1, wherein the attenuation factor gives rise to an error in the derived primary current flowing through the primary conductor that is not greater than a predetermined percentage selected according to the nature of the primary current flowing through the primary conductor.

3. The electrical interface according to claim 2, wherein the percentage error in the derived primary current is selected to be:
    not greater than 10% when the primary current is decaying; and
    not greater than 0.3% when the primary current is in steady state.

4. The electrical interface according to claim 1, wherein the integrator module is or includes one or more of:

a first rectangular integrator embodying a transfer function in the discrete time domain of the form $$H(z) = \frac{1}{1 - e^{-AT_s N_d} z^{-N_d}};$$

a second rectangular integrator embodying a transfer function in the discrete time domain of the form $$H(z) = \frac{1}{N_d} \frac{\sum_{k=0}^{N_d} z^{-k}}{1 - e^{-AT_s N_d} z^{-N_d}};$$

a trapezoidal integrator embodying a transfer function in the discrete time domain of the form $$H(z) = \frac{1}{N_d} \frac{\sum_{k=0}^{N_d} z^{-k} - \frac{1}{2} - \frac{1}{2} z^{-N_d}}{1 - e^{-AT_s N_d} z^{-N_d}};$$

a Taylor's approximation integrator embodying a transfer function in the discrete time domain of the form $$H(z) = \frac{1}{6} \left\{ \frac{1 + 4z^{-N_d/2} + z^{-N_d}}{1 - e^{-AT_s N_d} z^{-N_d}} \right\},$$

where,
A is the attenuation factor;
Ts is a sampling period of the input voltage signal; and
Nd is a down-sampling scale.

5. The electrical interface according to claim 1, wherein the integrator circuit additionally includes at least one averaging module arranged in communication with the output of the integrator module, the at least one averaging module being configured to calculate an average output voltage signal over one or more operating cycles of an electrical system of which the primary conductor forms a part and to subtract the said calculated average output voltage from the output voltage signal provided by the integrator module to establish a corrected output voltage signal.

6. The electrical interface according to claim 5, wherein the integrator circuit further includes a disturbance detector configured to detect a rise in current flowing through the primary conductor and thereafter suspend operation of the at least one averaging module while the disturbance remains.

7. The electrical interface according to claim 6, wherein the disturbance detector is configured to determine the absolute value of the sampled input voltage signal and to detect a rise in current flowing through the primary conductor when the absolute value of the sampled input voltage signal exceeds a predetermined threshold.

8. The electrical interface according to claim 5, wherein the integrator circuit still further includes a reconstruction module which is configured to derive the primary current flowing through the primary conductor by multiplying the corrected output voltage signal by a gain factor.

9. The electrical interface according to claim 8, wherein the reconstruction module is also configured to modify the corrected output voltage signal to compensate for errors arising from the attenuation factor.

10. The electrical interface according to claim 9, wherein the reconstruction module carries out one or more of phase compensation and steady state input signal compensation.

11. The electrical interface according to claim 8, wherein the reconstruction module is also configured to modify the gain factor according to a measured temperature of the electrical interface.

* * * * *